(12) United States Patent
Dunn

(10) Patent No.: US 10,999,941 B2
(45) Date of Patent: May 4, 2021

(54) HOUSING ASSEMBLY FOR AN INTEGRATED DISPLAY UNIT

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 16/750,347

(22) Filed: Jan. 23, 2020

(65) Prior Publication Data

US 2020/0163234 A1    May 21, 2020

Related U.S. Application Data

(63) Continuation of application No. 16/352,041, filed on Mar. 13, 2019, now Pat. No. 10,602,626.
(Continued)

(51) Int. Cl.
*H05K 5/00* (2006.01)
*H05K 7/20* (2006.01)
(Continued)

(52) U.S. Cl.
CPC ......... *H05K 5/0017* (2013.01); *H05K 5/0213* (2013.01); *H05K 7/20972* (2013.01); *B29C 48/12* (2019.02); *B29L 2031/003* (2013.01)

(58) Field of Classification Search
CPC .................................................... G06F 3/1446
See application file for complete search history.

(56) References Cited

U.S. PATENT DOCUMENTS 2,029,221 A    1/1936  Burgess et al.
2,678,860 A    5/1954  Peterson
(Continued)

FOREIGN PATENT DOCUMENTS

AU     2015229457 B2    3/2019
CA        2780884 C     4/2019
(Continued)

OTHER PUBLICATIONS

The Free Dictionary, Bolt—Definition of bolt by the Free Dictionary, Jun. 15, 2016, 1 Page.
(Continued)

*Primary Examiner* — Jerry Wu
(74) *Attorney, Agent, or Firm* — Standley Law Group LLP; Jeffrey S. Standley; Adam J. Smith

(57) ABSTRACT

Methods for forming an electronic display assembly are provided. A first and second side member are extruded, each side member including a number of channels extending parallel to one another along a length of the respective side member. A display unit subassembly is secured between the side members. The display unit includes an electronic display, a first and second horizontal member, and an open loop pathway. The horizontal members are secured within the channel. Interior surfaces of the side members form a portion of a closed loop pathway which extends through the display unit subassembly. Exterior surfaces of the side members form an outer housing for the electronic display assembly.

17 Claims, 12 Drawing Sheets

US 10,999,941 B2

Page 2

Related U.S. Application Data

(60) Provisional application No. 62/711,908, filed on Jul. 30, 2018.

(51) Int. Cl.
*H05K 5/02* (2006.01)
*B29L 31/00* (2006.01)
*B29C 48/12* (2019.01)

(56) References Cited

U.S. PATENT DOCUMENTS

| | | | |
|---|---|---|---|
| 3,587,186 A | 6/1971 | Lane | |
| 3,984,931 A | 10/1976 | Belokin, Jr. | |
| 4,169,327 A | 10/1979 | Stilling | |
| 4,267,657 A | 5/1981 | Kloke | |
| 4,327,513 A | 5/1982 | de Gunzburg | |
| 4,452,000 A | 6/1984 | Gandy | |
| 4,547,987 A | 10/1985 | Stilling | |
| 4,759,143 A | 7/1988 | Pomerleau | |
| 4,817,317 A | 4/1989 | Kovalak, Jr. | |
| 4,903,423 A | 2/1990 | Hinca | |
| 4,905,390 A | 3/1990 | Stilling | |
| 5,025,355 A | 6/1991 | Harwood | |
| 5,179,367 A | 1/1993 | Shimizu | |
| 5,299,109 A | 3/1994 | Grondal | |
| 5,423,142 A | 6/1995 | Douglas et al. | |
| 5,457,905 A | 10/1995 | Kaplan | |
| 5,493,802 A | 2/1996 | Simson | |
| D373,120 S | 8/1996 | Andre et al. | |
| 5,717,424 A | 2/1998 | Simson et al. | |
| 5,755,050 A | 5/1998 | Aiken | |
| 5,803,424 A | 9/1998 | Keehn et al. | |
| 5,899,027 A | 5/1999 | St. Louis | |
| D415,736 S | 10/1999 | Witte | |
| 6,050,833 A | 4/2000 | Danzyger et al. | |
| 6,172,869 B1 | 1/2001 | Hood, III et al. | |
| 6,198,222 B1 | 3/2001 | Chang | |
| 6,231,446 B1 | 5/2001 | Majima et al. | |
| 6,405,463 B1 | 6/2002 | Roddy et al. | |
| 6,469,752 B1 | 10/2002 | Ishikawa et al. | |
| D467,561 S | 12/2002 | Kosciolek | |
| 6,494,429 B2 | 12/2002 | Tajima | |
| 6,557,284 B2 | 5/2003 | Nolan | |
| 6,748,685 B2 | 6/2004 | Peel | |
| 6,758,002 B1 | 7/2004 | Duguay | |
| 6,962,528 B2 | 11/2005 | Yokota | |
| 6,976,330 B2 | 12/2005 | Milliken | |
| D530,686 S | 10/2006 | Reza | |
| 7,210,839 B2 | 5/2007 | Jung et al. | |
| D544,848 S | 6/2007 | Marz et al. | |
| 7,226,176 B1 | 6/2007 | Huang | |
| 7,292,435 B2 | 11/2007 | She | |
| 7,339,782 B1 | 3/2008 | Landes et al. | |
| 7,513,830 B2 | 4/2009 | Hajder et al. | |
| D595,678 S | 7/2009 | Dunn | |
| 7,589,958 B2 | 9/2009 | Smith | |
| 7,591,508 B2 | 9/2009 | Chang | |
| 7,601,067 B2 | 10/2009 | Anderson | |
| 7,609,506 B2 | 10/2009 | Aguirre | |
| D608,775 S | 1/2010 | Leung | |
| 7,768,775 B2 | 8/2010 | Kim | |
| D635,614 S | 4/2011 | Yan | |
| 7,985,139 B2 | 7/2011 | Lind et al. | |
| 8,006,435 B2 | 8/2011 | DeBlonk et al. | |
| 8,016,452 B2 | 9/2011 | Dunn | |
| 8,116,081 B2 | 2/2012 | Crick, Jr. | |
| D657,421 S | 4/2012 | Yan | |
| D657,422 S | 4/2012 | Yan | |
| D669,938 S | 10/2012 | Lard et al. | |
| 8,418,387 B2 | 4/2013 | Swatt et al. | |
| 8,537,302 B2 | 9/2013 | Dunn | |
| D704,265 S | 5/2014 | Yan | |
| 9,235,232 B2 | 1/2016 | King | |
| 9,282,676 B1 | 3/2016 | Diaz | |
| 9,313,447 B2 | 4/2016 | Dunn et al. | |
| 9,317,060 B2 | 4/2016 | Dunn et al. | |
| 9,655,289 B2 | 5/2017 | Dunn et al. | |
| 9,703,320 B2 | 7/2017 | Bowers et al. | |
| 9,823,690 B2 | 11/2017 | Bowers et al. | |
| 10,143,106 B2 | 11/2018 | Diaz | |
| 10,212,845 B2 | 2/2019 | Dunn et al. | |
| 10,398,058 B2 | 8/2019 | Diaz | |
| 10,401,016 B2 | 9/2019 | Coo | |
| 2001/0032404 A1 | 10/2001 | Hillstrom | |
| 2001/0043290 A1 | 11/2001 | Yamamoto | |
| 2001/0043293 A1 | 11/2001 | Inoue | |
| 2002/0009978 A1 | 1/2002 | Dukach et al. | |
| 2002/0149714 A1 | 10/2002 | Anderson et al. | |
| 2003/0039094 A1 | 2/2003 | Sarkinen et al. | |
| 2004/0025389 A1 | 2/2004 | Peterson | |
| 2004/0103570 A1 | 6/2004 | Ruttenberg | |
| 2004/0212548 A1 | 10/2004 | Ruttenberg | |
| 2004/0257492 A1 | 12/2004 | Mai et al. | |
| 2005/0105178 A1 | 5/2005 | Kim | |
| 2005/0127796 A1 | 6/2005 | Olesen et al. | |
| 2006/0012985 A1 | 1/2006 | Archie, Jr. et al. | |
| 2006/0077636 A1 | 4/2006 | Kim | |
| 2006/0137294 A1 | 6/2006 | Waits et al. | |
| 2006/0215421 A1 | 9/2006 | Chang et al. | |
| 2006/0218828 A1 | 10/2006 | Schrimpf et al. | |
| 2007/0021217 A1 | 1/2007 | Wu | |
| 2007/0070615 A1 | 3/2007 | Joslin et al. | |
| 2007/0139574 A1 | 6/2007 | Ko et al. | |
| 2007/0253205 A1 | 11/2007 | Welker | |
| 2008/0002350 A1 | 1/2008 | Farrugia | |
| 2008/0054144 A1 | 3/2008 | Wohlford | |
| 2008/0100186 A1 | 5/2008 | Li | |
| 2008/0174456 A1 | 7/2008 | Warren | |
| 2008/0236005 A1 | 10/2008 | Isayev et al. | |
| 2008/0255901 A1 | 10/2008 | Carroll et al. | |
| 2008/0276507 A1 | 11/2008 | Hines | |
| 2008/0304219 A1 | 12/2008 | Chen | |
| 2009/0009041 A1 | 1/2009 | Zeidler | |
| 2009/0016004 A1 | 1/2009 | McCoy | |
| 2009/0104989 A1 | 4/2009 | Williams et al. | |
| 2009/0126906 A1 | 5/2009 | Dunn | |
| 2009/0141199 A1 | 6/2009 | Fujikawa | |
| 2009/0231807 A1 | 9/2009 | Bouissiere | |
| 2009/0241388 A1 | 10/2009 | Dunn | |
| 2009/0241437 A1 | 10/2009 | Steinle et al. | |
| 2009/0278007 A1 | 11/2009 | Taylor | |
| 2009/0279240 A1 | 11/2009 | Karppanen | |
| 2010/0171889 A1 | 7/2010 | Pantel et al. | |
| 2010/0220249 A1 | 9/2010 | Nakamichi et al. | |
| 2010/0226091 A1* | 9/2010 | Dunn | G02F 1/133385 361/695 |
| 2011/0019348 A1 | 1/2011 | Kludt et al. | |
| 2011/0090630 A1 | 4/2011 | Bergeron et al. | |
| 2011/0114384 A1 | 5/2011 | Sakamoto et al. | |
| 2011/0116000 A1 | 5/2011 | Dunn et al. | |
| 2011/0116231 A1 | 5/2011 | Dunn et al. | |
| 2011/0134356 A1 | 6/2011 | Swatt et al. | |
| 2011/0141672 A1 | 6/2011 | Farley, Jr. et al. | |
| 2011/0227467 A1 | 9/2011 | Foppe, Jr. et al. | |
| 2011/0297810 A1 | 12/2011 | Tachibana | |
| 2012/0050958 A1 | 3/2012 | Sanford et al. | |
| 2012/0105424 A1 | 5/2012 | Lee et al. | |
| 2012/0131936 A1 | 5/2012 | Yoshida et al. | |
| 2012/0253672 A1 | 10/2012 | Hoshino et al. | |
| 2013/0211583 A1 | 8/2013 | Borra | |
| 2013/0270975 A1 | 10/2013 | Dunn et al. | |
| 2013/0294039 A1 | 11/2013 | Chao | |
| 2014/0044147 A1 | 2/2014 | Wyatt et al. | |
| 2014/0208626 A1 | 7/2014 | Moon | |
| 2015/0009627 A1 | 1/2015 | Dunn et al. | |
| 2015/0264826 A1 | 9/2015 | Dunn et al. | |
| 2016/0192536 A1 | 6/2016 | Diaz | |
| 2016/0242329 A1 | 8/2016 | DeMars | |
| 2017/0074453 A1 | 3/2017 | Bowers et al. | |
| 2017/0083043 A1* | 3/2017 | Bowers | G06F 1/1601 |
| 2017/0231112 A1 | 8/2017 | Dunn et al. | |
| 2017/0345346 A1 | 11/2017 | Hong et al. | |
| 2018/0315356 A1 | 11/2018 | Dunn et al. | |
| 2019/0059175 A1 | 2/2019 | Diaz | |

(56) References Cited

U.S. PATENT DOCUMENTS

| | | |
|---|---|---|
| 2019/0239365 A1 | 8/2019 | Dunn et al. |
| 2019/0335613 A1 | 10/2019 | Diaz |
| 2020/0037456 A1 | 1/2020 | Dunn |

FOREIGN PATENT DOCUMENTS

| | | |
|---|---|---|
| EP | 3040766 A1 | 7/2016 |
| EP | 3468321 A1 | 4/2019 |
| EP | 3117693 B1 | 8/2019 |
| GB | 153110 | 11/1920 |
| JP | 2005292939 A | 10/2005 |
| JP | 2005332253 A | 12/2005 |
| JP | 2006198344 | 8/2006 |
| KR | 200163508 Y1 | 7/2000 |
| KR | 200206768 Y1 | 12/2000 |
| KR | 200236278 Y1 | 10/2001 |
| KR | 2002-0057425 A | 7/2002 |
| KR | 200286961 Y1 | 8/2002 |
| KR | 200366674 Y1 | 11/2004 |
| WO | WO2011059793 A2 | 5/2011 |
| WO | WO2012006620 A2 | 1/2012 |
| WO | 2016/102980 A1 | 6/2016 |
| WO | 2020028045 A1 | 2/2020 |

OTHER PUBLICATIONS

The Free Dictionary, Screw—Definition of screw by The Free Dictionary, Jun. 15, 2016, 1 Page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
CIVIQ Smartscapes, FlexVue Ferro 55P/55L, Mar. 16, 2017, 4 pages.
CIVIQ, Invalidity Contentions, Jan. 24, 2018, 51 pages.
CIVIQ, Invalidity Claim Chart, Appendix E, Jan. 24, 2018, 28 pages.
CIVIQ, Invalidity Claim Chart, Appendix I, Mar. 22, 2018, 4 pages.
CIVIQ, Smart City Devices, webpage, Jan. 30, 2019, 5 pages.
CIVIQ, Smart City Platform, webpage, Jan. 30, 2019, 10 pages.
CIVIQ, Smartscapes devices, webpage, Jan. 30, 2019, 1 page.

\* cited by examiner

HOUSING ASSEMBLY FOR AN INTEGRATED DISPLAY UNIT

CROSS-REFERENCE TO RELATED APPLICATION

This application is a continuation of U.S. Non-provisional patent application Ser. No. 16/352,041 filed Mar. 13, 2019, which claims the benefit of U.S. Provisional Patent Application Ser. No. 62/711,908 filed Jul. 30, 2018, the disclosures of each of which are hereby incorporated by reference as if fully restated herein.

TECHNICAL FIELD

Exemplary embodiments relate generally to a system and method for providing a housing assembly for an integrated display unit.

BACKGROUND AND SUMMARY OF THE INVENTION

Electronic displays and associated equipment are increasingly being used in cities and other urban environments, shopping malls, retail outlets, restaurants, sporting venues, universities, educational centers, medical facilities, and other business and public locations for advertising, messaging, wayfinding, public emergency notifications, and the like. Such electronic displays are often placed in partially or completely ruggedized units, to protect the various components of the electronic displays and associated equipment from the environmental elements, vandalism, and the like. Such display units may comprise various electronic components necessary to power, operate, remotely manage content, remote monitoring of the systems health status, and thermally manage the electronic displays and associated equipment.

Such display units are generally placed within a separate outer shell. As aesthetics are important when placing such display units in public locations, the outer shell may comprise a variety of decorative components. The outer shell may be configured for, but not limited to, mounting to the ground, street, sidewalk, existing street lighting poles, exterior or interior walls, flat bed trailers for mobile deployment, or the like. Alternatively, or in addition, as space is often limited in such public locations, the outer shell may be provided in the form of street furniture such as, but not limited to, benches, bus shelters, kiosks, wayfinding units, telephone booths, or the like. In other exemplary embodiments, the outer shell may be configured for suspension from an overhead member, elevated from the ground, or secured in a storefront window to name a few examples.

In many cases, the display unit is designed and manufactured by one individual or entity while the outer shell is designed and manufactured by another individual or entity. In such cases, the display unit designer and manufacturer must work with the outer shell designer and manufacturer to ensure compatibility of the display unit with the outer shell. The processing of making the display unit compatible with the outer shell is time consuming and expensive and often requires design changes and compromises by both parties. Even where the display unit and outer shell designer and manufacturer are one and the same, the display unit is often manufactured as a single, sealed unit and the outer shell is likewise often manufactured as a separate unit configured to receive the display unit. This results in a protective shell (the display unit) placed within a second semi-protective, functional, or aesthetic outer shell. Such an arrangement results in added manufacturing complexity, weight, cost, and the like. Therefore, what is needed is a housing assembly for an integrated display unit.

These disclosures provide a housing assembly for an integrated display unit. The housing assembly may serve as both the outer shell as well as the frame for the display unit. This may reduce complexity, costs, weight, simplify the design, and the like. A first and second side housing member may be configured to receive a first and second horizontal member. The first and second side housing member may extend substantially vertical, spaced apart from one another, and substantially parallel with one another from a bottom horizontal member. The first and second side housing members may form at least a portion of the side walls of the display unit, thereby at least partially, or in some cases fully, sealing the display unit.

The first and second horizontal members may extend between the first and second side housing members. The first and second horizontal members may extend substantially horizontal, spaced apart from one another, and substantially parallel with one another. The first and second horizontal members may form at least a portion of the top and bottom of the display unit, thereby at least partially sealing, or in some cases fully, the display unit. A first and second receiving section may be located near the bottom of the housing assembly and may be configured to receive external supports for mounting to the street, sidewalk, ground, pole, wall, or other surface. The display unit may comprise an open loop pathway for ambient air which thermally interacts with a closed loop pathway for circulating gas.

The first and second side housing members may comprise one or more channels configured to receive corresponding protrusions on the first and second horizontal members. The channels may be configured to permit vertical placement of the first and second horizontal members within the first and second side housing members in a substantially sealed arrangement. Each of the first and second side housing members may comprise a first and second raised edge which permits the snap fitting of decorative cladding or fascia.

The housing assembly may comprise an upper portion for housing additional equipment. The upper portion may comprise a frame which is secured to the display unit and an upper portion housing. The upper portion housing may be configured to receive the additional equipment. One or more of sides of the upper portion housing, such as but not limited to the vertical or horizontal sides, may be comprised of glass or other low loss, low attenuation materials to enable the broadcast and reception of broadband radio frequencies.

A transition area may extend between the display unit and the upper portion. A common open loop intake may ingest ambient air, a first portion of which may travel into an open loop pathway of the display unit and a second portion of which may travel into the upper portion. In other embodiments, the common open loop intake may be provided for both the upper portion and the display unit which may be one in the same.

One or more upper portion intake apertures may be located in the upper portion housing to permit the ingestion of ambient air. For example, without limitation, an open loop aperture may be provided in the upper portion which draws in ambient air for both the upper portion and the display unit. In other exemplary embodiments, a vent may extend along an upper portion of the upper portion housing to permit the exhaustion of ambient air ingested into the upper portion. In such embodiments, one or more fans may be positioned on or near the upper portion intake apertures to encourage or force such ingestion as well as circulation within the upper portion housing and exhaustion from the vent. In other embodiments, the upper portion may be cooled by convection through ambient air passing over the external surfaces of the upper portion.

Further features and advantages of the devices and systems disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
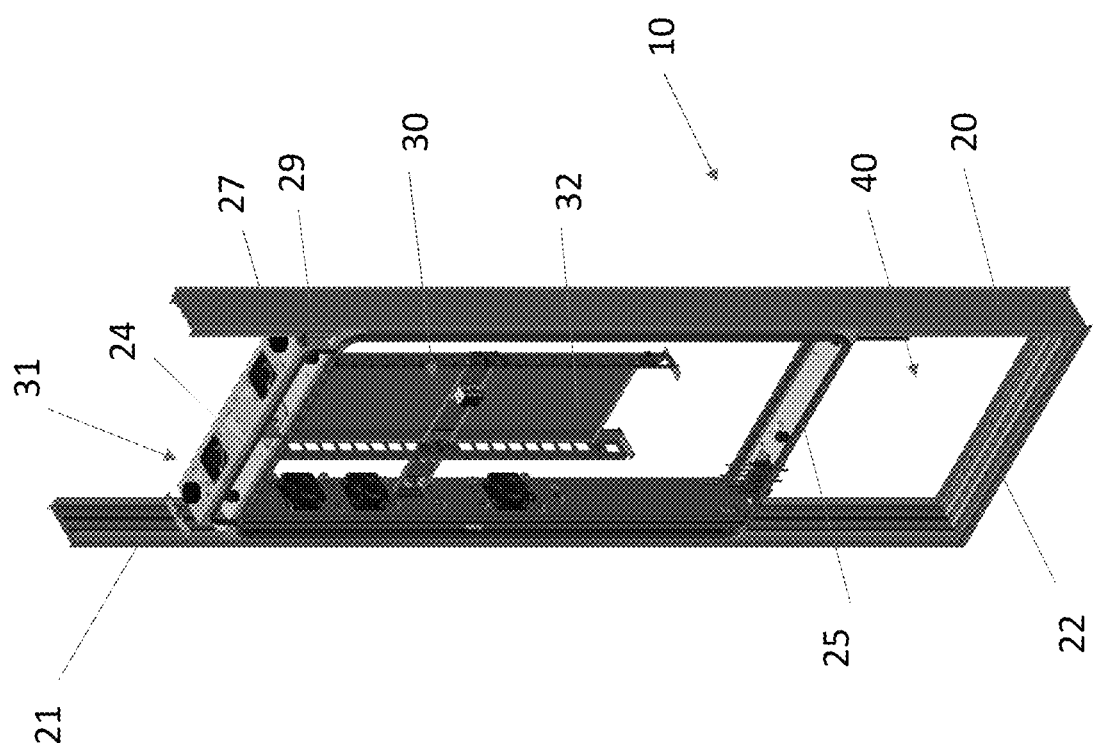
FIG. 1 is a front perspective view of an exemplary housing assembly and an integrated display unit with certain components removed for clarity.

FIG. 1 is a front perspective view of an exemplary housing assembly 10 for an integrated display unit 30. FIG. 1 illustrates some, but not all, components of the display unit 30. The display unit 30 may comprise one or more electronic displays (including associated backlights), fans, electronic components for operating the electronic displays, customer equipment, cameras, microphones, computing devices, environmental sensors, communications equipment, USB charging stations, audio speakers, and the like (hereinafter also referred to generally as "equipment"). In some embodiments, the display unit 30 may comprise a first and second electronic display placed above and below one another. The lower display may be located to meet ADA standards. In some embodiments, the integrated display unit may have electronic displays on one, both, or all sides of the housing assembly 10. The display unit 30 may define a cavity and may comprise one or more storage devices 32 located in said cavity and configured to hold or otherwise secure such components and equipment. Such storage devices 32 may include, server racks, brackets, bins, shelves, posts, mounts, and the like, such as but not limited to, a 1U server rack.

The display unit 30 may comprise an open loop pathway for ambient air. The display unit 30 may further comprise a closed loop pathway for circulating gas. The open loop pathway and the closed loop pathway may be configured to permit thermal interaction of the ambient air in the open loop pathway with the circulating gas in the closed loop pathway. For example, without limitation, such thermal interaction may be provided at a heat exchanger.

Figure 2:
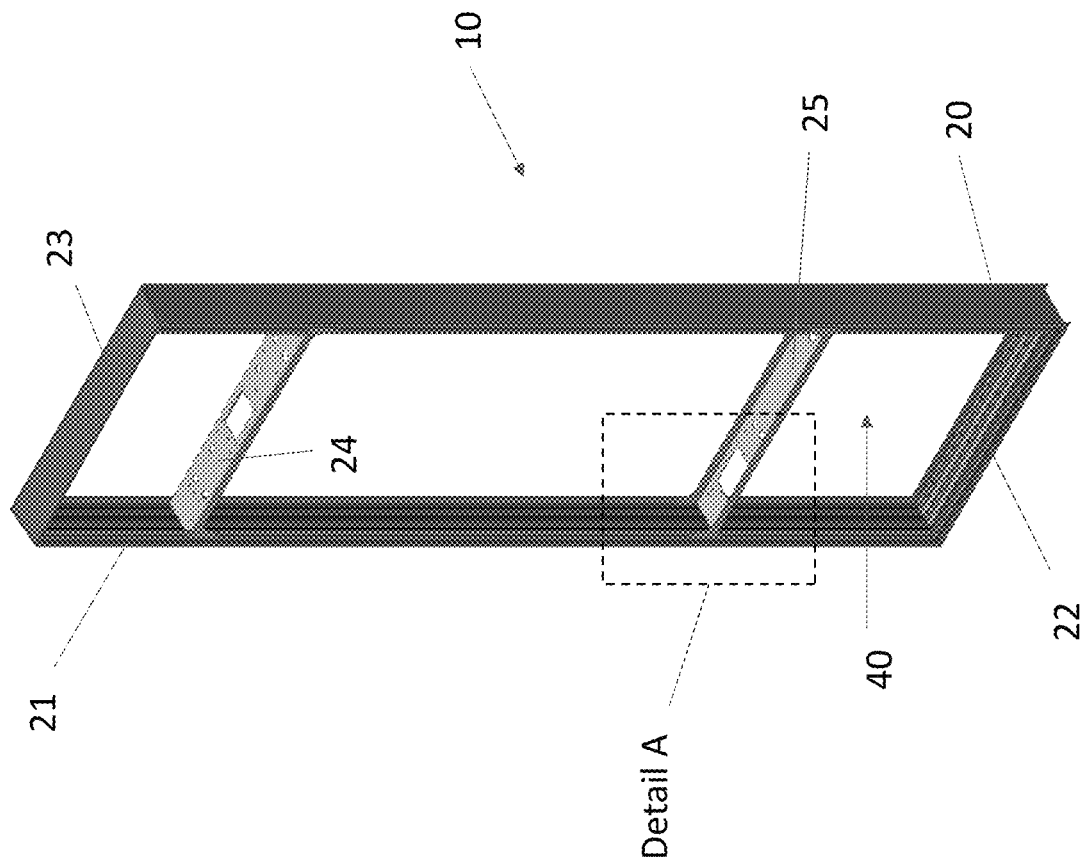
FIG. 2 is a front perspective view of the housing assembly of FIG. 1 with additional components removed for clarity and also indicating Detail A.

Exemplary arrangements, without limitation, of such display units 30 comprising open loop pathways and closed loop pathways are shown and described in U.S. applications Ser. Nos. 12/234,307, 12/556,029 and 12/753,298 filed Apr. 2, 2010, the discloses of all of which are hereby incorporated by reference in their entireties. Another exemplary display unit 30 is shown and described in U.S. application Ser. No. 15/886,889 filed on Feb. 2, 2018, which is hereby incorporated by reference in its entirety. Other exemplary display units 30 may be available from Manufacturing Resources International, Inc. of Alpharetta, Ga. (https://mri-inc.net/). The provided examples are not intended to be limiting. Furthermore, these display units 30 may, in some cases, be referred to as Panel Display Modules ("PDM"). The term PDM is not intended to require any particular type, design, or configuration of display unit. Any type of display unit 30 having any number of components in any arrangement is contemplated. FIG. 2 is a front perspective view of the housing assembly 10 with certain components of the display unit 30 removed for clarity. The housing assembly 10 may comprise a first side housing member 20 and a second side housing member 21. The first and second side housing members 20 and 21 may form a portion of the outer surface of the housing assembly 10. In exemplary embodiments, the first and second side housing members 20 and 21 may be spaced apart from one another and extend substantially vertical, though any arrangement is contemplated. The first and second side housing members 20 and 21 may extend substantially parallel with one another, though such is not required. In exemplary embodiments, the first and second side housing members 20 and 21 may form at least a portion of the sidewalls of the display unit 30. The first and second side housing members 20 and 21 may be configured to partially or fully seal the display unit 30.

A bottom horizontal member 22 may extend between the first and second side housing members 20 and 21. In exemplary embodiments, the bottom horizontal member 22 may extend between the distal end of the first and second side housing members 20 and 21. A top horizontal member 23 may likewise extend between the first and second side housing members 20 and 21. In exemplary embodiments, the top horizontal member 23 may extend between a proximal end of the first and second side housing members 20 and 21. The top and bottom horizontal members 23 and 22 may be comprised of metal and may be welded to the first and second side housing members 20 and 21. The top and bottom horizontal members 23 and 22 may be spaced apart from one another and extend substantially parallel to one another, though such is not required.

A first horizontal member 24 and a second horizontal member 25 may each extend between the first and second side housing members 20 and 21. In exemplary embodiments, the first and second horizontal members 24 and 25 are spaced apart from one another and extend substantially horizontal, though any arrangement is contemplated. The first and second horizontal members 24 and 25 may extend substantially parallel with one another, though such is not required. In exemplary embodiments, the first and second horizontal members 24 and 25 may form at least a portion of the upper and lower seal for the display unit 30. The first and second horizontal members 24 and 25 may be configured to partially or fully seal the display unit 30. It is contemplated that at least a portion 31 of the display unit 30 may extend above or below the first and/or second horizontal members 24 and 25.

The first and second side housing member 20 and 21 may replace the side walls of the display unit 30. Similarly, the first and second horizontal member 24 and 25 may replace the top and bottom walls of the display unit 30. Such an arrangement may simplify the design and reduce manufacturing costs and complexity.

Figure 4:
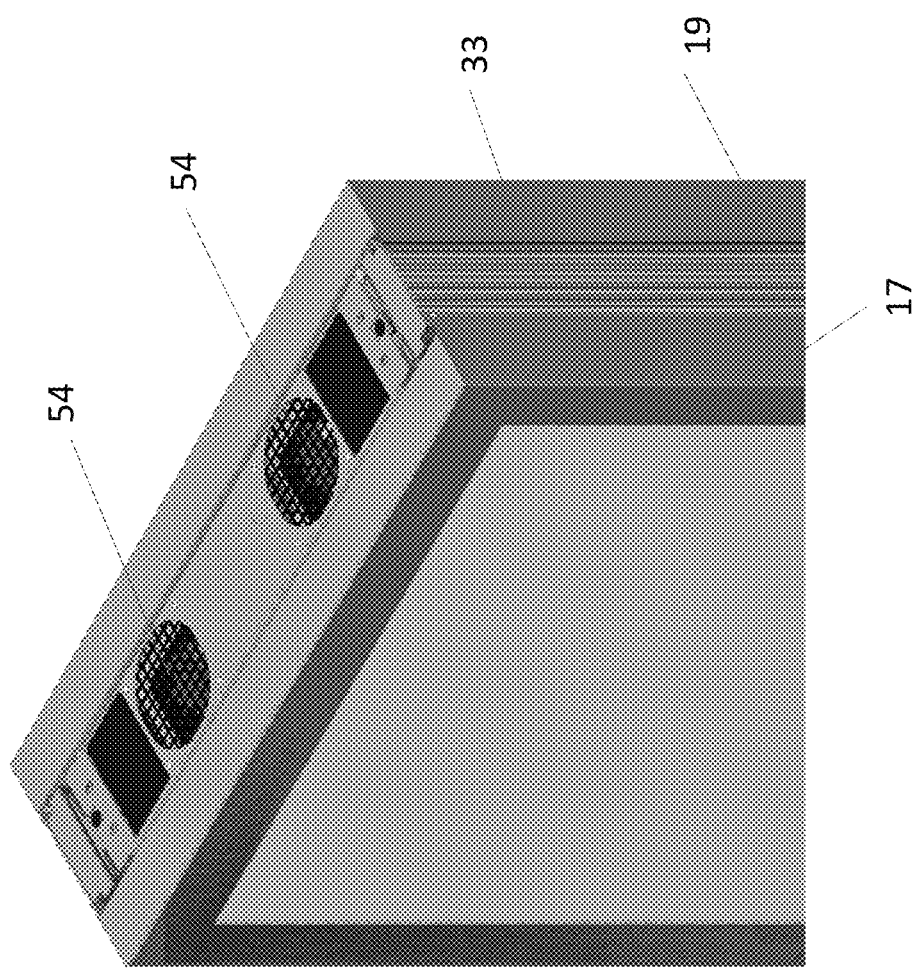
FIG. 4 is a detailed front perspective view of the housing assembly with exemplary external cladding installed.

The housing assembly 10 may comprise decorative outer features, such as but not limited to, cladding 33 as shown in FIG. 4, for example without limitation. The housing assembly 10 may be configured for mounting to the ground, street, sidewalk, wall, pole, a flatbed truck for mobile deployment, an interior wall, an exterior wall, or any other surface. The housing assembly 10 may, alternatively or in addition, comprise street furniture such as, but not limited to, benches, bus shelters, kiosks, wayfinding units, telephone booths, or the like. In other exemplary embodiments, the housing assembly 10 may be configured for suspension from an overhead member, elevated from the ground, or secured in a storefront window.

In exemplary embodiments, the housing assembly 10, particularly the area located below the second horizontal member 25 and between the first and second side housing members 20 and 21 may define a cavity 40. The cavity 40 may be kept intentionally free of components or equipment, particularly water sensitive electronic equipment. In this way, certain levels of flooding will not damage any such equipment or components.

Figure 3:
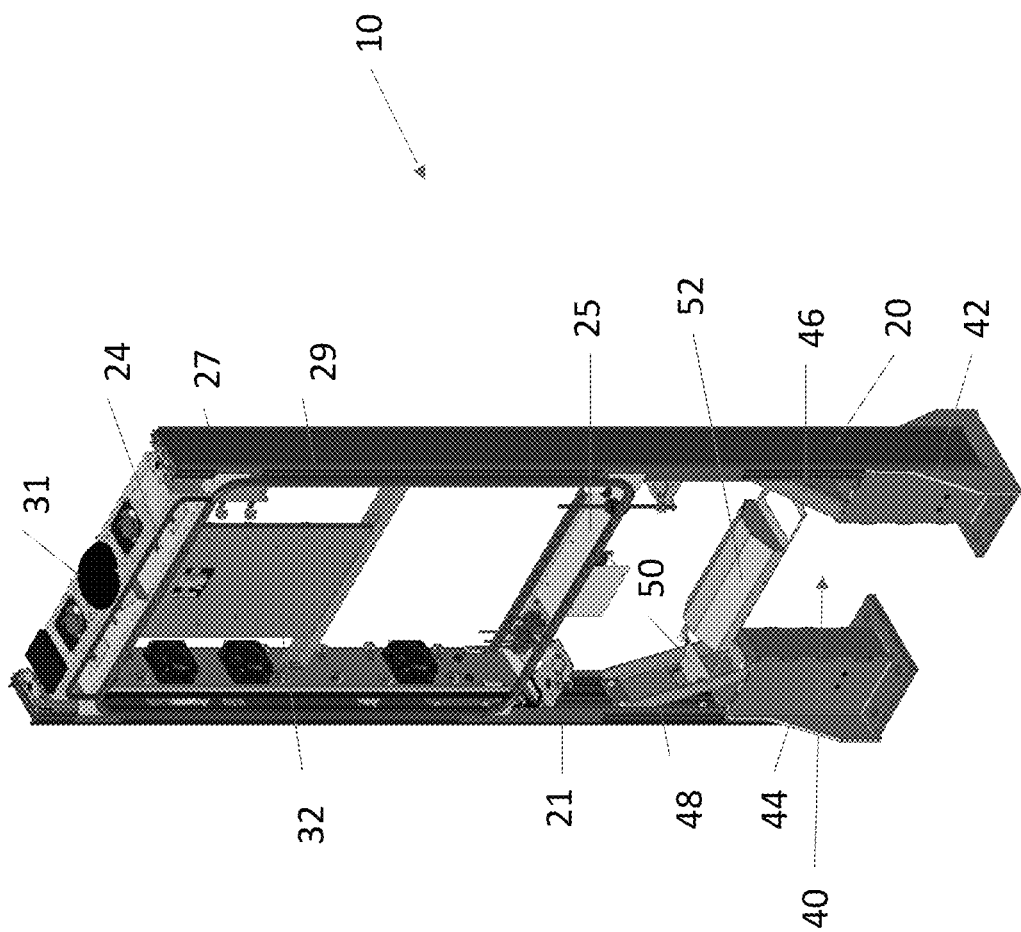
FIG. 3 is a front prospective view of another exemplary housing assembly and integrated display unit with certain components removed for clarity.

FIG. 3 is a front prospective view of another exemplary housing assembly 10 with certain components removed for clarity. The housing assembly 10 may be configured to mate with external supports. For example, without limitation, the housing assembly 10 may comprise a first and second receiving section 42 and 44, which may be located on a lower portion of the first and second side housing members 20 and 21, respectively. The first and second receiving sections 42 and 44 may be substantially rectangular in shape, though any shape in contemplated. The first and second receiving sections 42 and 44 may be configured to receive one or more external supports, which may be mounted to the ground, parking lot, sidewalk, or other surface, and may extend therefrom and into the first and second receiving sections 42 and 44 where they may be secured. A first and second angled member 46 and 48 may extend at an angle from the first and second side housing members 20 and 21, respectively, to the first and second receiving sections 42 and 44, respectively. The first and second angled members 46 and 48 may be configured to increase structural stability to the housing assembly 10, particularly lateral stability and rigidity.

In some embodiments, a horizontal support member 50 may extend between the first and second angled members 46 and 48. A second storage device 52 may be located on the horizontal support member 50 any may be configured to receive additional components for operating the electronic displays or other peripherals and/or customer equipment.

The first side housing member 20 and the second side housing member 21 may each comprise a first raised edge 27 and a second raised edge 29. The first and second raised edges 27 and 29 may extend the length of the first and second side housing members 20 and 21, respectively, though such is not required. The first and second raised edges 27 and 29 may extend substantially parallel with one another. The first and second raised edges 27 and 29 may extend along either edge of the first and second side housing members 20 and 21, respectively. The first and second raised edges 27 and 29 may be configured to accept one or more pieces of cladding 33. Such cladding 33 may be snap fit, press fit, or otherwise configured to mate with the first and second raised edges 27 and 29.

It is notable that while several of the embodiments shown herein illustrate display units 30 comprising electronic display oriented in a substantially portrait orientation. However, it is contemplated that one or more of the electronic display in one or more display units 30 may likewise be placed in a landscape orientation.

Figure 5:
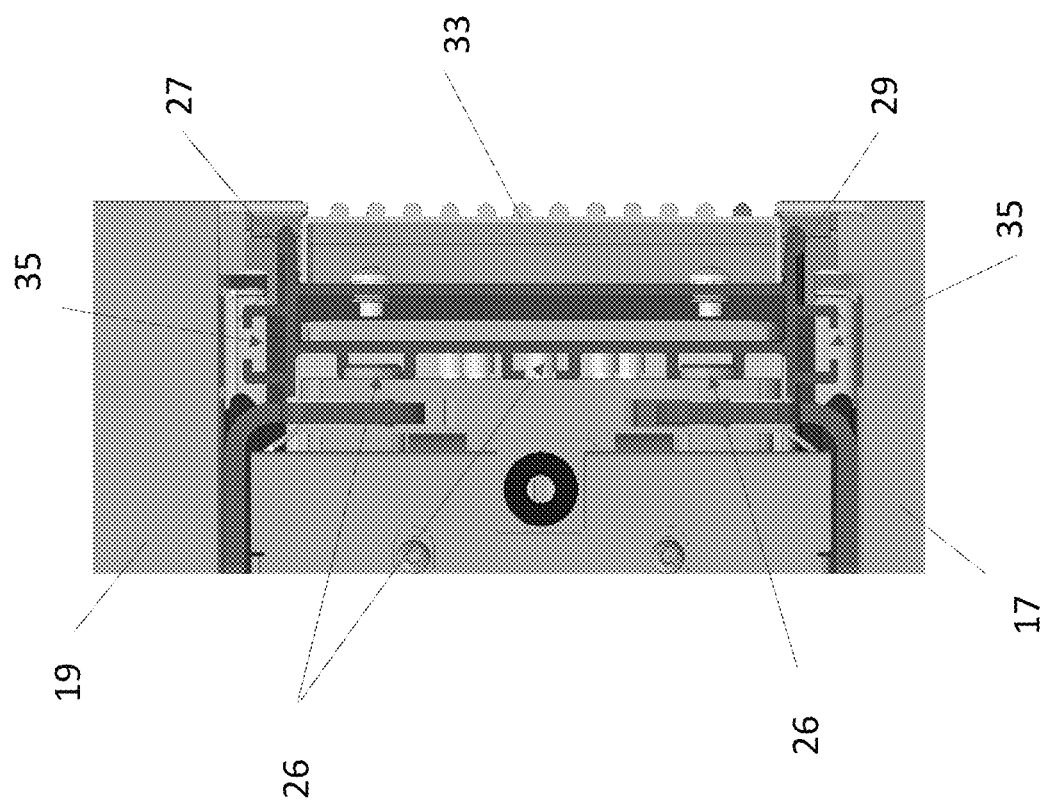
FIG. 5 is a detailed top sectional view of the housing assembly of FIG. 4.

FIG. 4 is a front perspective view of the housing assembly 10 with exemplary cladding 33 installed. The housing assembly 10 may comprise a front housing portion 17 and a rear housing portion 19. The front housing portion 17 may house a first electronic display and the rear housing portion 19 may house a second electronic display, though such is not required. One or more ambient air intakes 54 may be located within the housing assembly 10. The ambient air intakes 54 may form a part of the open loop pathway and may be configured to ingest ambient air. The front housing portion 17 and the rear housing portion 19 may be mounted to the remainder of the housing assembly 10 in a hinged manner. FIG. 5 is a detailed top sectional view of the housing assembly 10. The cladding 33 may be of any size, shape, and texture. In exemplary embodiments, various types of cladding 33 and decorative features may be interchangeably mounted to the first and second raised edges 27 and 29 such that the external appearance of the housing assembly 10 may be altered as desired.

Figure 6:
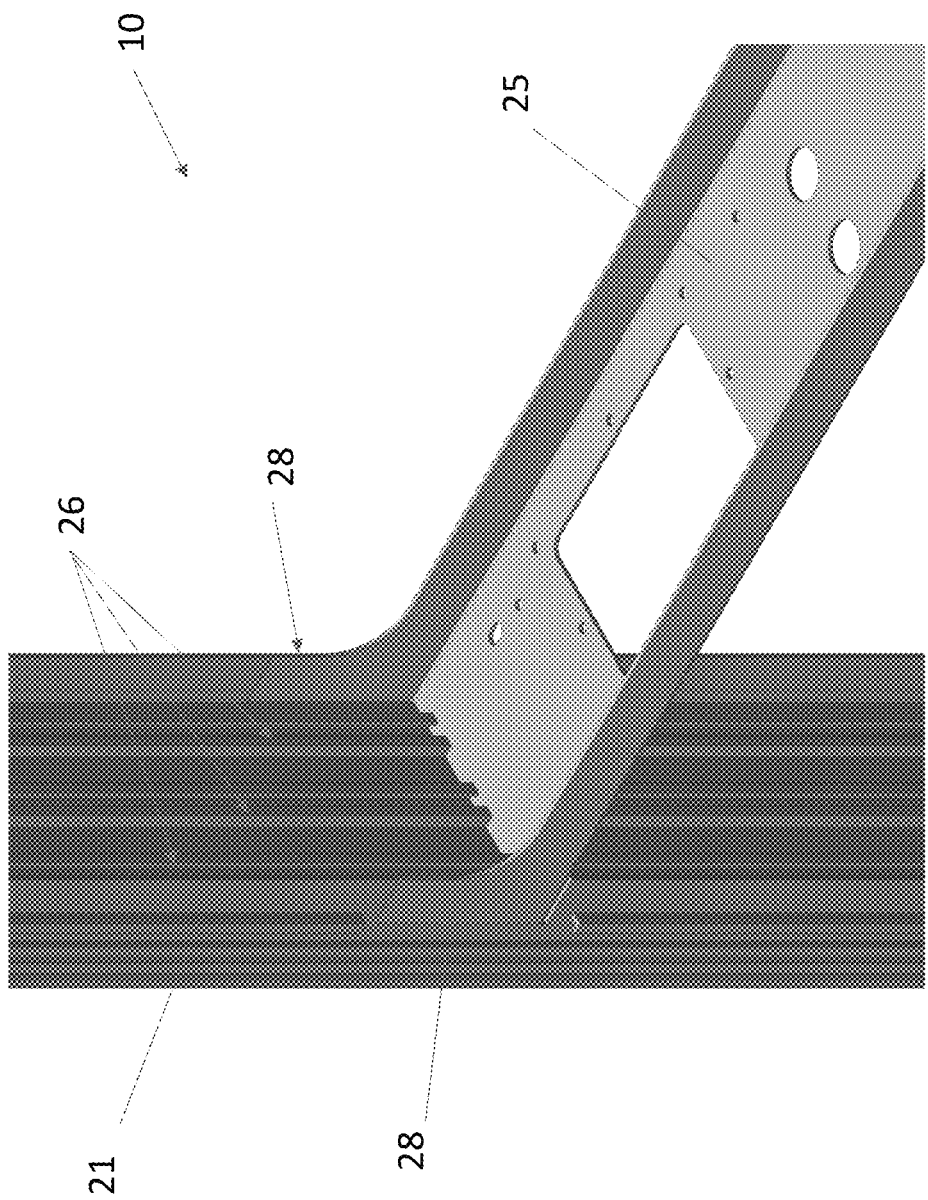
FIG. 6 is a detailed front perspective view of Detail A of FIG. 2.

FIG. 6 is a detailed front perspective view of Detail A in FIG. 2. The first and second side housing members 20 and 21 may each comprise one or more channels 26 configured to receive corresponding protrusions or fasteners in the second horizontal member 25 to join the second horizontal member 25 to the first or second side housing members 20 or 21, respectively. In exemplary embodiments, the channels 26 may extend the entire length of the first or second side housing members 20 and 21, though such is not required.

The channels 26 may be configured to permit the vertical placement and movement of the second horizontal member 25 along the first and second side housing members 20 and 21.

The first and second side housing members 20 and 21 may each further comprise one or more additional channels 35. The additional channels 35 may be configured to receive corresponding protrusions or fasteners in the front or rear housing portions 17 and 19, respectively.

The first and second side housing members 20 and 21 may each further comprise a first and a second notch configured to receive a corresponding protrusion 28 in the second horizontal member 25. In exemplary embodiments, the first and second notch are located on the outside of the first or second side housing member 20 or 21. The first and second notch and corresponding protrusion 28 may be configured to secure the second horizontal member 25 at a vertical location along the first or second side housing member 20 or 21. An identical or similar set of first and second notches may be located in an upper portion of the first and second side housing members 20 and 21 and may be configured to receive identical or similar protrusions in the first horizontal member 24. In this way, the first horizontal member 24 may be secured at a position along the first and second side housing members 20 and 21 above the second horizontal member 25.

In exemplary embodiments, the first and second side housing members 20 and 21, including the channels 26, may be formed by extrusion. Similarly, the first and second horizontal members 24 and 25 may likewise be formed by extrusion. Such extrusion may advantageously permit various size housing assemblies 10 to be formed. This may be particularly advantageous for accommodating various size electronic displays. The first and second side housing members 20 and 21 may be comprised of a metal, such as but not limited to, aluminum, steel, titanium, or the like. Alternatively, or in addition, the first and second side housing members 20 and 21 may be comprised of a polymer or the like.

Figure 7:
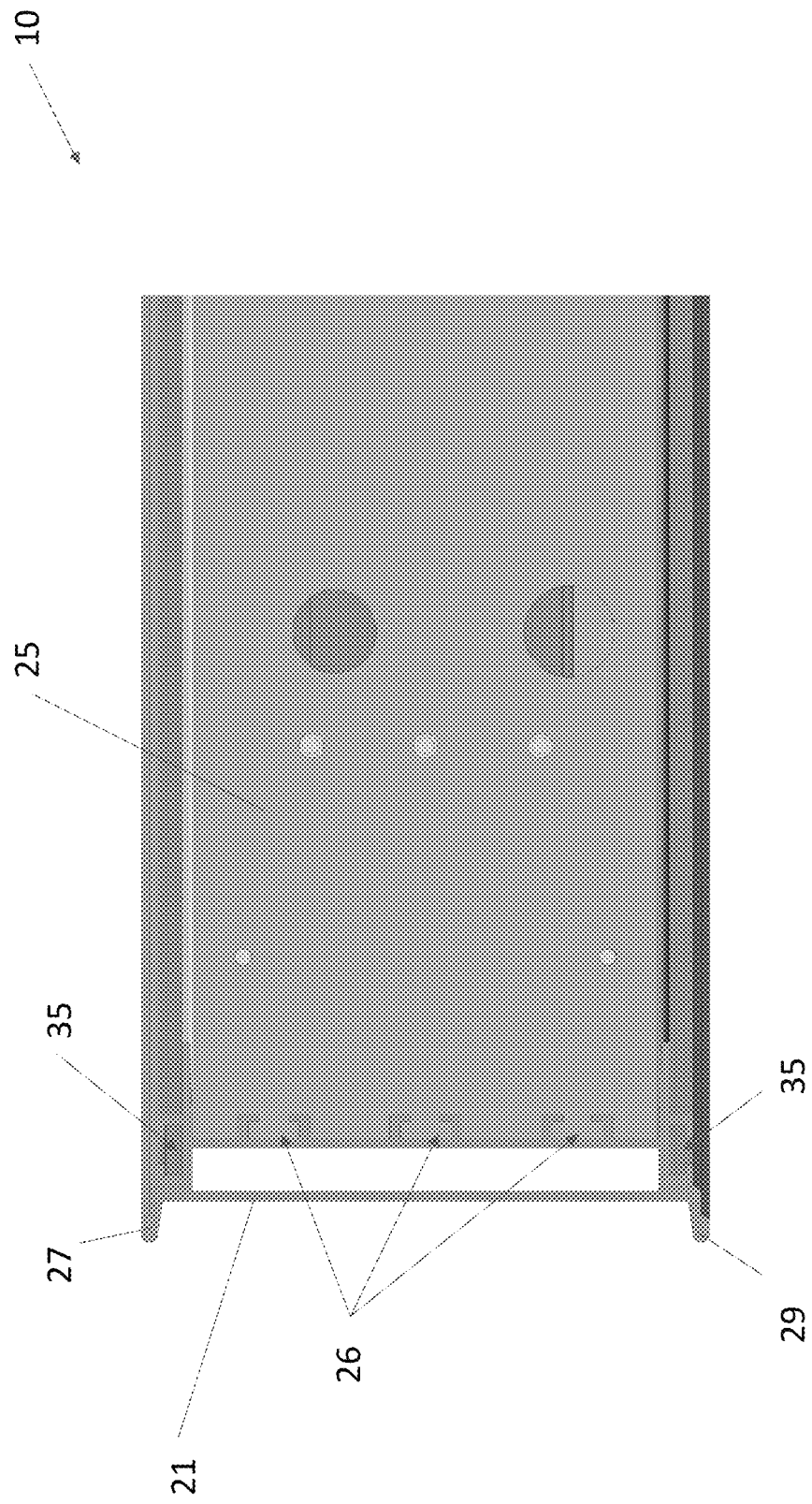
FIG. 7 is a top view of Detail A of FIG. 6.

FIG. 7 is a top view of Detail A of FIG. 3. The channels 26, and the additional channels 35, may comprise substantially "C" shaped brackets, though any shape, arrangement, and number of channels 26, and additional channels 35, are contemplated. The channels 26, and the additional channels 35, may be configured to receive corresponding protrusions in the second horizontal member 25. The channels 26, and the additional channels 35, may be further configured to receive any number of components, such as but not limited to, various components of the housing assembly 10 and/or the display unit 30.

While some of the figures herein are illustrated with regards to one of the first or second side housing members 20 or 21 as well as the first or second horizontal member 24 or 25, it is contemplated that the same, or a substantially similar, arrangement may be utilized with respect to any of the aforementioned components.

Figure 8:
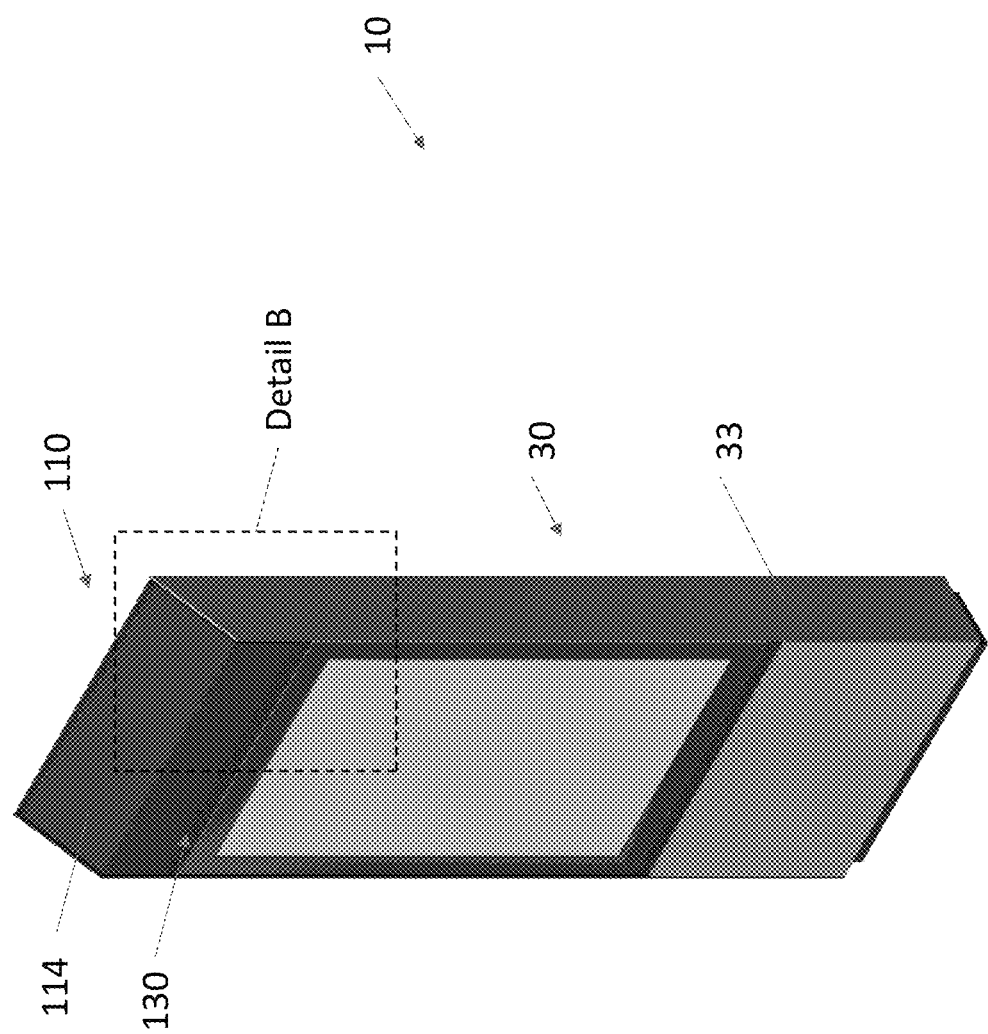
FIG. 8 is a front perspective view of the housing assembly with exemplary external cladding and an exemplary upper portion installed also indicating Detail B.
Figure 9A:
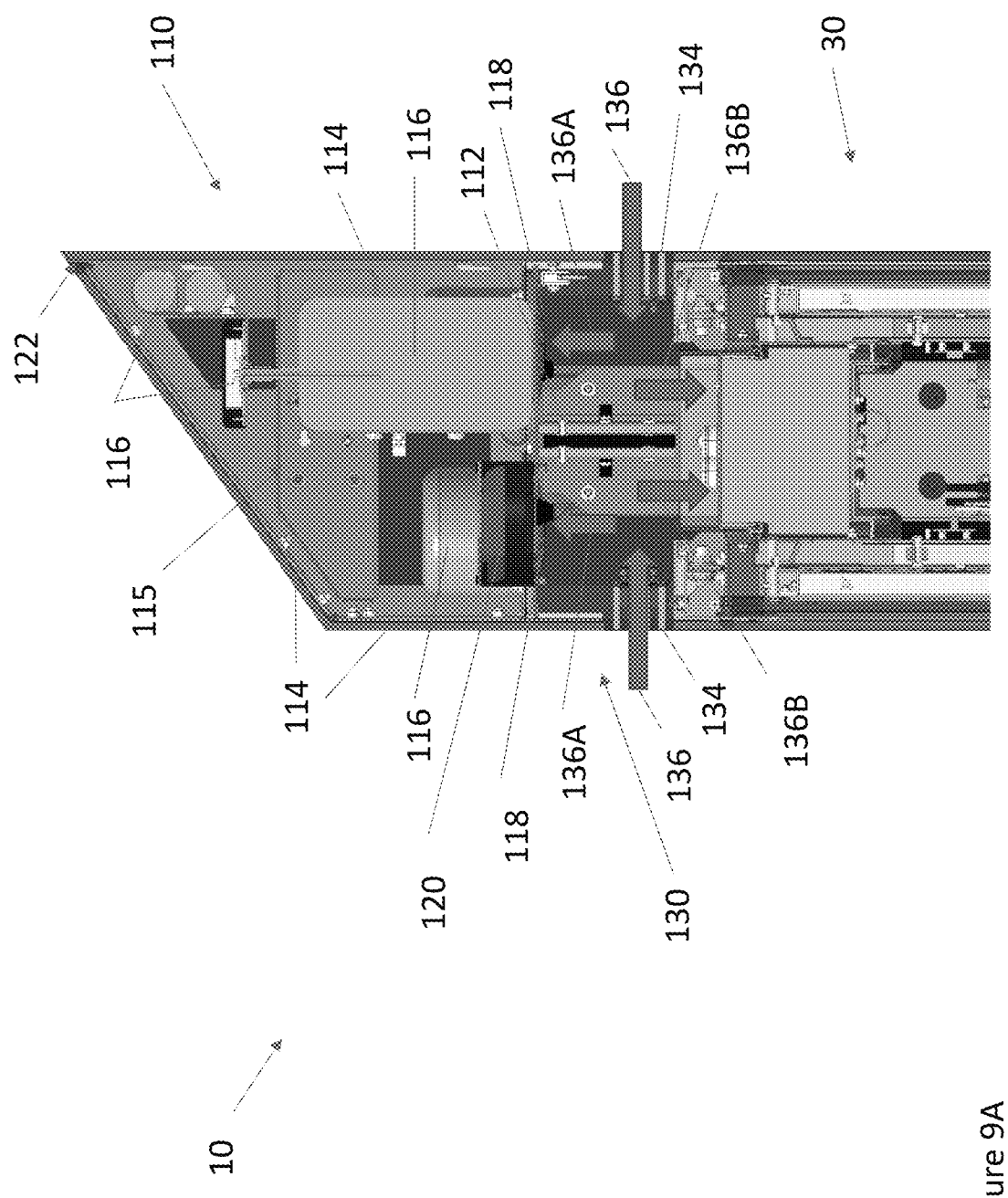
FIG. 9A is a detailed side sectional view of Detail B of FIG. 8.

FIG. 8 is a front perspective view of the housing assembly 10. The housing assembly 10 may comprise an upper portion 110, though particularly as illustrated with respect to FIG. 4, such is not required. FIG. 9A is a detailed side sectional view of Detail B of FIG. 8.

The upper portion 110 may extend above the display unit 30. A frame 112 may extended between and secure the upper portion 110 to the display unit 30. The frame 112 may comprise any number of members. An upper portion housing 114 may define an upper portion cavity 115 which may be sized to receive additional equipment 116, such as but not limited to, antennas, power over ethernet equipment, cellular radio, wireless routers and connectivity equipment, and other network communication devices as well as environmental sensors, air quality monitors, cameras, microphones, computing devices, proximity sensors, speakers, and the like, though such is not required. Various mounting devices may be located inside the upper portion 110 to accommodate the additional equipment 116, though such is not required. For example, without limitation, the upper portion 110 may be included for aesthetic reasons or standardization of manufacturing purposes but may be substantially empty. One or more members of the frame 112 may be hollow so as to accommodate power lines, communication lines, and the like. The power lines, communication lines, and the like may extend to power supplies, communications equipment, or networked equipment located in the display unit 30 or external to the housing assembly 10. In this way, power and communications may travel to and from the display unit 30 and the upper portion 110 as well as to and from sources outside of the housing assembly 10 (e.g., networks, utilities, and the like). In exemplary embodiments, when placed in a closed position, the upper portion 110 may form a substantially watertight enclosure, though such is not required.

One or more sides of the upper portion housing 114 may be mounted to the frame 112 in a hinged fashion so as to selectively permit access to the additional equipment 116. One or more struts, gas springs, prop rods, or the like may extend between the frame 112 and the hinged portions of the upper portion housing 114. Such sides of the upper portion housing 114 may be selectively attached to other sides of the upper portion housing 114 and/or the frame 112 by way of latches, such as but not limited to, magnets, slam latches, or the like. In other exemplary embodiments, one or more panels of the upper portion housing 114 may be slid in various directions, such as but not limited to along rails, in order to permit access to the inside of the upper portion 110.

One or more sides of the upper portion housing may be comprised of glass, such as but not limited to black glass, or other radio permissive material such that broadband radio and other waves emitted from and transmitted to the additional equipment 116 may enter and exit the upper portion housing 114.

In exemplary embodiments, the housing assembly 10 may comprise a transition area 130 located between the upper portion 110 and the display unit 30. The upper portion housing 114 may extend into the transition area 130 to partially enclose the transition area 130. In other exemplary embodiments, a separate transition housing may be used. The transition area 130 may comprise a common open loop intake 134. Open loop fluids, such as ambient air 136 may be ingested through the common open loop intake 134 and may be separated such that a first flow 136A of the ingested ambient air travels into the upper portion 110 and a second flow 136B of the ingested ambient air travels into the display unit 30. A grid, screen, mesh, filter, or the like may be placed on, over, or near the open loop intake 134, though such is not required.

In exemplary embodiments, a first open loop intake 134 may be located on one side of the housing assembly 10, and a second open loop intake 134 may be located on another side of the housing assembly 10. The frame 112 may extend through the transition area 130 and may separate the ambient air 136 ingested from first open loop intake 134 from the ambient air ingested from the second open loop intake 134, though such is not required.

In some embodiments, one or more upper portion apertures 118 may be located in the upper portion housing 114 to permit the first flow 136A to enter the upper portion 110. One or more fans 120 may be positioned on or near the upper portion apertures 118 to encourage or force such ingestion and exhaustion of ambient as well as circulation of ambient air within the upper portion 110. Alternatively, or in addition, the one or more fans 120 may be located within the upper portion 110 to alternatively or additionally force the ingested ambient air 136A to circulate within the upper portion.

The first flow 136A may be vented from the upper portion 110 by way of an upper portion exhaust 122. The upper portion exhaust 122 may comprise a gap between panels of the upper portion housing 114. In exemplary embodiments, the upper portion exhaust 122 may be located along an upper edge of the upper portion 110.

Figure 9B:
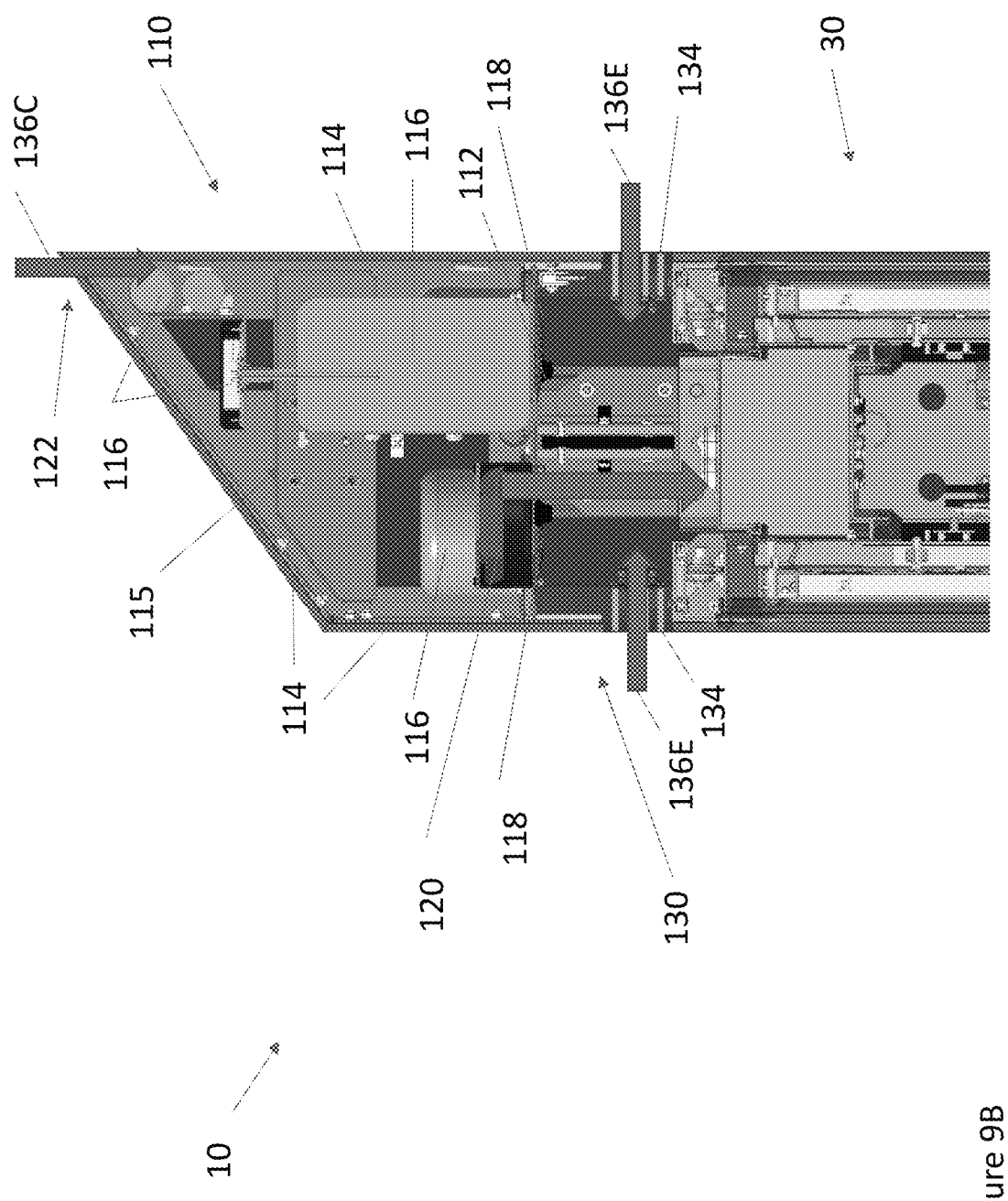
FIG. 9B is a detailed side sectional view of another exemplary embodiment of Detail B of FIG. 8.

As illustrated in FIG. 9B, in other exemplary embodiments, the upper portion exhaust 122 may instead be configured to be an upper portion intake 122. A first flow 136C of ambient air may be ingested by way of the upper portion intake 122. The first flow 136C may travel through the upper portion 110 to the display unit 30. In some embodiments, a second flow 136D of ambient air may be ingested into the transition section 130 for circulation within the display unit 30, though such is not required.

In still other exemplary embodiments, the upper portion 110 may be cooled by convection by way of ambient air passing over the external surfaces of the upper portion 110.

Figure 10:
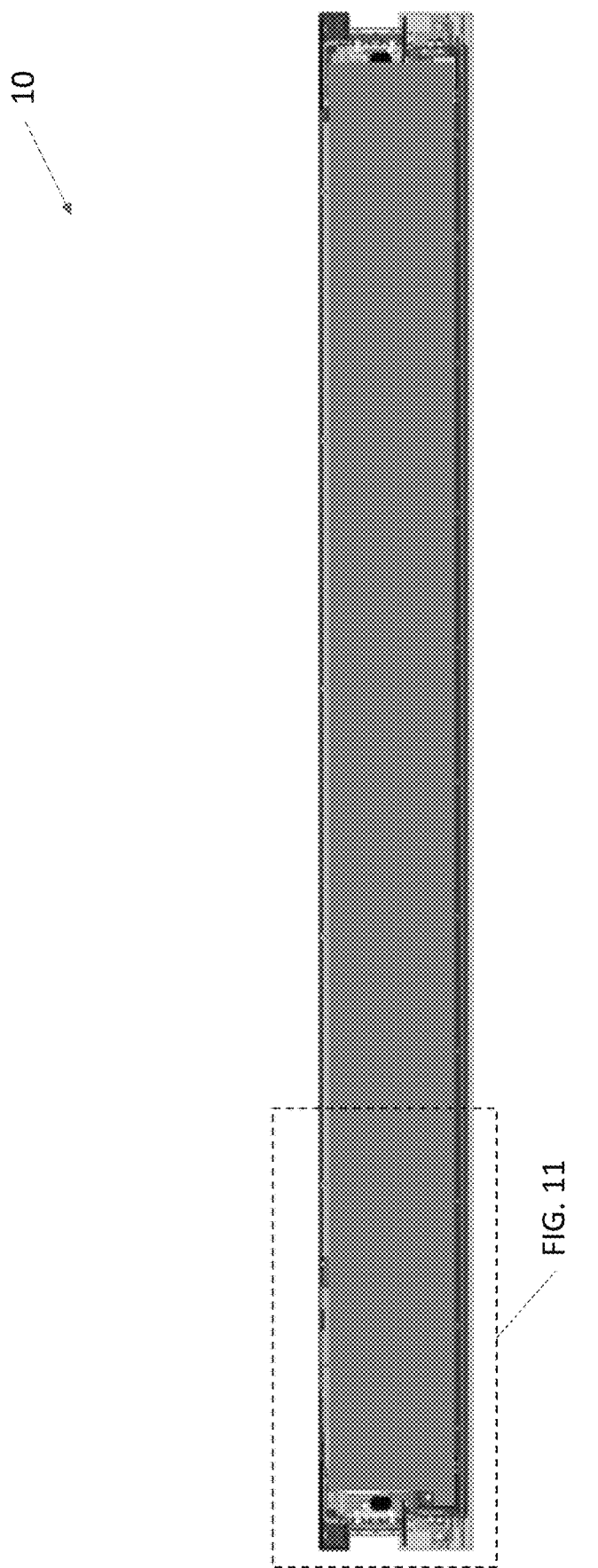
FIG. 10 is a top sectional view of another exemplary housing assembly and an integrated display unit.
Figure 11:
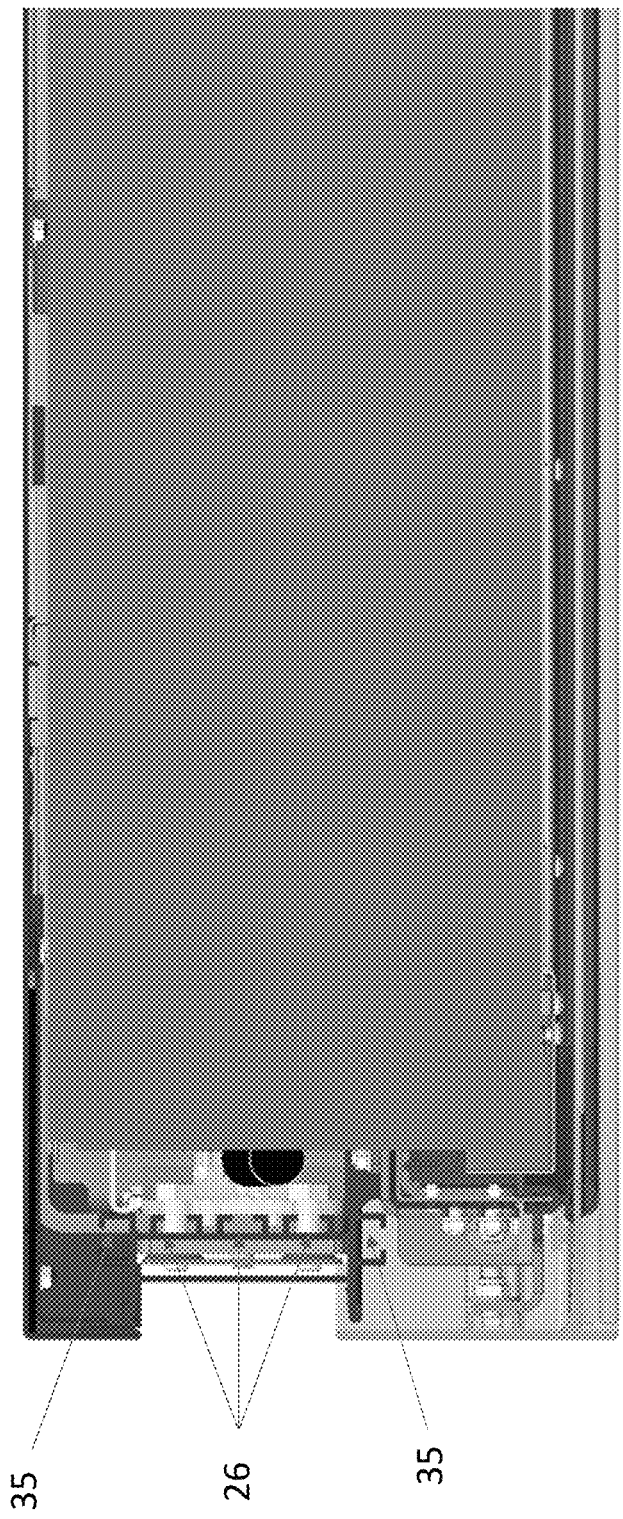
FIG. 11 is a detailed top sectional view of the assembly of FIG. 10.

FIG. 10 is a top sectional view of another exemplary housing assembly and an integrated display unit and FIG. 11 is a detailed top sectional view of the assembly of FIG. 10. These figures are provided to demonstrate, in a simplified fashion, that a landscape orientated assembly 10 with a landscape-oriented display unit 30. Certain internal components of the display units 30 are obscured in the provided drawings to focus attention on the orientation of the display units 30. It is contemplated that the assembly 10 and the display unit 30 may be provided in a portrait orientation, a landscape orientation, or any other orientation, such as but not limited to, various angles, tilts, or rotations.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. A method for forming an electronic display assembly comprising the steps of:
   extruding a first side member and a second side member, wherein each of said first and second side members comprise a number of channels and a number of additional channels, wherein each of said number of channels of the first side member extend alongside one another along a length of the first side member, and wherein each of said number of channels of the second side member extend alongside one another along a length of the second side member;
   pre-fabricating a display unit subassembly comprising a front portion comprising a first electronic display, a rear portion positioned back-to-back with the front portion and comprising a second electronic display, an open loop pathway for ambient air, a first horizontal member, and a second horizontal member; and
   securing said display unit subassembly between said first and second side members, wherein said first and second horizontal members are secured within each of the number of channels of said first side member and said second side member to secure said display unit subassembly between said first and second side members at a vertical height, and wherein a rear surface of said front portion is secured within at least one of said additional channels of said first and second side member and a rear surface of said rear portion is secured within at least one other one of said additional channels of said first and second side member;
   wherein interior surfaces of said first side member and said second side member form a portion of a closed loop pathway for circulating gas which extends through said display unit subassembly when said display unit subassembly is secured between said first and second side members, and wherein exterior surfaces of said first side member and said second side member form at least a portion of an outer housing for said electronic display assembly.

2. The method of claim 1 wherein:
   said closed loop pathway comprises a cavity located reward of the electronic display;
   said cavity is located within said display unit subassembly;
   said display unit subassembly comprises a storage device within said cavity; and
   said storage device is configured to receive any of a number of different types of electronic equipment.

3. The method of claim 2 wherein:
   said display unit subassembly comprises at least one open loop fan positioned to draw ambient air through the open loop pathway; and
   said display unit subassembly comprises at least one closed loop fan positioned to draw circulating gas through the closed loop pathway.

4. The method of claim 3 wherein:
   said cavity is defined, at least in part, by said first and second side members and said first and second horizontal members.

5. The method of claim 1 further comprising the steps of:
   securing a first angled member to the first side member; and
   securing a second angled member to the second side member.

6. The method of claim 5 further comprising the steps of:
   securing a horizontal support between the first and second angled members.

7. The method of claim 6 further comprising the steps of:
   providing a storage device at the horizontal support, wherein said horizontal support is positioned below the first and second horizontal members.

8. The method of claim 1 further comprising the steps of:
   forming a first pair of notches in the first side member at a first vertical height;
   forming a second pair of notches in the first side member at a second vertical below said first vertical height;
   forming a third pair of notches in the second side member at a third vertical height equal to said first vertical height;

forming a fourth pair of notches in the second side member at a fourth vertical height equal to said second vertical height;

forming a first pair of protrusions at a first end first horizontal member;

forming a second pair of protrusions at a second end of said first horizontal member;

forming a third pair of protrusions at a first end said second horizontal member;

forming a fourth pair of protrusions at a second end of said second horizontal member;

securing said first pair of protrusions within said first pair of notches;

securing said second pair of protrusions within said third pair of notches;

securing said third pair of protrusions within said second pair of notches; and securing said fourth pair of protrusions within said fourth pair of notches.

9. The method of claim 1 further comprising the steps of:

securing decorative cladding or fascia to said exterior surface of said first side member and said second side member.

10. The method of claim 9 wherein:

said decorative cladding or fascia is snap fitted to raised edges located along said first and second side members.

11. The method of claim 1 wherein:

said front portion and said rear portion are secured to said display unit subassembly in a hinged fashion.

12. The method of claim 1 wherein:

said open loop pathway travels along a backlight for the electronic display.

13. A method for forming an electronic display assembly comprising the steps of:

extruding a first side member comprising a first number of channels, wherein each of said first number of channels extend alongside one another and along a length of the first side member, and a first number of additional channels;

extruding a second side member comprising a second number of channels, wherein each of said second number of channels extend alongside one another and along a length of the second side member, and a second number of additional channels;

pre-fabricating a display unit subassembly comprising a front portion comprising a first electronic display layer, a rear portion positioned back-to-back with the front portion and comprising a second electronic display layer, an open loop pathway for ambient air, a first horizontal member, and a second horizontal member; and securing said display unit subassembly between said first side member and said second side member at a vertical height by securing a first end of said first horizontal member and said second horizontal member within each of said first number of channels and a second end of said first horizontal member and said second horizontal member within each of said second number of channels, and by securing a rear surface of said front portion within at least one of said first and second number of additional channels of said first and second side members and a rear surface of said rear portion within at least one other one of said first and second number of additional channels of said first and second side members;

wherein interior surfaces of said first side member and said second side member form a portion of a closed loop pathway for circulating gas which passes through said display unit subassembly, and wherein exterior surfaces of said first side member and said second side member form at least a portion of an outer housing for said electronic display assembly.

14. The method of claim 13 wherein:

said closed loop pathway comprises a cavity located within said display unit subassembly; and said display unit subassembly comprises a server rack located within said cavity.

15. The method of claim 14 wherein:

said cavity is defined, at least in part, by said first and second side members and said first and second horizontal members.

16. The method of claim 15 further comprising the steps of:

mounting a number of electronic devices for operation of the display unit subassembly to said server rack.

17. The method of claim 16 wherein:

said first side member extends parallel to said second side member; and said first horizontal member extends parallel to said second horizontal member.

\* \* \* \* \*

UNITED STATES PATENT AND TRADEMARK OFFICE
CERTIFICATE OF CORRECTION

Page 1 of 1

PATENT NO. : 10,999,941 B2
APPLICATION NO. : 16/750347
DATED : May 4, 2021
INVENTOR(S) : William Dunn It is certified that error appears in the above-identified patent and that said Letters Patent is hereby corrected as shown below:

In the Specification

Column 4, Line 37, after Ser. Nos. 12/234,307, please insert -- filed September 19, 2008, --.
Column 4, Line 37, after 12/556,029, please insert -- filed September 9, 2009, --.
Column 8, Line 54, please delete "1368" and insert -- 136B --.

Signed and Sealed this
Eighth Day of June, 2021

Drew Hirshfeld
*Performing the Functions and Duties of the
Under Secretary of Commerce for Intellectual Property and
Director of the United States Patent and Trademark Office*